United States Patent
Sumida et al.

(10) Patent No.: US 9,893,110 B2
(45) Date of Patent: Feb. 13, 2018

(54) METHOD OF MANUFACTURING SOLID-STATE IMAGE SENSOR, SOLID-STATE IMAGE SENSOR, AND CAMERA

(71) Applicant: CANON KABUSHIKI KAISHA, Tokyo (JP)

(72) Inventors: Takayuki Sumida, Kawasaki (JP); Masao Ishioka, Tokyo (JP); Kei Aoki, Ebina (JP); Yasuhiro Kawabata, Kawasaki (JP); Naoki Inatani, Kawasaki (JP); Masaki Kurihara, Koza-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 111 days.

(21) Appl. No.: 15/078,128

(22) Filed: Mar. 23, 2016

(65) Prior Publication Data

US 2016/0293657 A1   Oct. 6, 2016

(30) Foreign Application Priority Data

Apr. 6, 2015   (JP) .................. 2015-077949

(51) Int. Cl.
*H01L 27/146* (2006.01)
*H04N 9/04* (2006.01)

(52) U.S. Cl.
CPC .. *H01L 27/14645* (2013.01); *H01L 27/14621* (2013.01); *H01L 27/14623* (2013.01); *H01L 27/14627* (2013.01); *H01L 27/14636* (2013.01); *H01L 27/14685* (2013.01)

(58) Field of Classification Search
CPC ........ H01L 27/14645; H01L 27/14636; H01L 27/14621; H01L 27/14685
See application file for complete search history.

(56) References Cited

U.S. PATENT DOCUMENTS

| | | | |
|---|---|---|---|
| 8,786,739 B2 | 7/2014 | Kurihara | |
| 9,412,785 B2* | 8/2016 | Kurihara | ........... H01L 27/14621 |
| 2015/0056741 A1* | 2/2015 | Kurihara | ........... H01L 27/14621 438/70 |
| 2015/0236069 A1 | 8/2015 | Inatani et al. | |

FOREIGN PATENT DOCUMENTS

| | | |
|---|---|---|
| JP | 2-181967 A | 7/1990 |
| JP | 2010-062417 A | 3/2010 |
| JP | 2011-165923 A | 8/2011 |

* cited by examiner

*Primary Examiner* — Seahvosh Nikmanesh
(74) *Attorney, Agent, or Firm* — Fitzpatrick, Cella, Harper & Scinto (57) ABSTRACT

A method of manufacturing a solid-state image sensor is provided. The method comprises preparing a structure which is covered by a protective film, depositing a first material by using a first color filter material on the protective film, forming a first color filter from the first material, depositing a second material by using a second color filter material after the forming the first color filter and forming a second color filter from the second material. An upper surface of the protective film has a concave portion. A part of the first material enters the concave portion in the depositing the first material, the first material is patterned so as to form a member in the concave portion from the first material in the forming the first color filter and the second material covers the member in the depositing the second material.

11 Claims, 7 Drawing Sheets

METHOD OF MANUFACTURING SOLID-STATE IMAGE SENSOR, SOLID-STATE IMAGE SENSOR, AND CAMERA

BACKGROUND OF THE INVENTION

Field of the Invention

The present invention relates to a method of manufacturing a solid-state image sensor, a solid-state image sensor, and a camera.

Description of the Related Art

In a solid-state image sensor, a concave portion may exist on the surface of a structure where a solid-state image sensing element is formed. When forming a color filter, the concave portion causes thickness unevenness, that is, a striation of the color filter. Japanese Patent Laid-Open No. 2-181967 has described a technique of depositing a resin film to embed a concave portion before forming a color filter, and then removing the resin film deposited in a pixel region and planarizing a structure surface.

SUMMARY OF THE INVENTION

In a step described in Japanese Patent Laid-Open No. 2-181967, however, an additional step of planarizing a concave portion before forming a color filter is needed. This causes problems such as a decrease in productivity and an increase in production cost.

Some embodiments of the present invention provide a technique of reducing occurrence of a striation while suppressing the decrease in productivity when forming the color filter.

According to some embodiments, a method of manufacturing a solid-state image sensor, the method comprising: preparing a structure which includes a first region where photoelectric conversion is performed and a second region where a peripheral circuit is arranged, and in which a wiring layer and a protective film covering the wiring layer are arranged; depositing, over the structure, a first material film by using a color filter material of a first type; forming a color filter of the first type positioned in the first region from the first material film by patterning the first material film; depositing, over the structure, a second material film by using a color filter material of a second type different from the color filter material of the first type after the forming the color filter of the first type; and forming a color filter of the second type positioned in the first region from the second material film by patterning the second material film, wherein the structure has a concave portion of an upper surface of the protective film in the second region, a ratio of a width and a length of the concave portion being not less than three in a planar view with respect to the upper surface of the protective film, a part of the first material film enters the concave portion in the depositing the first material film, the first material film is patterned so as to form a member including the part of the first material film from the first material film in the forming the color filter of the first type, and the second material film covers the member in the depositing the second material film, is provided.

According to some other embodiments, a solid-state image sensor comprising a structure which includes a first region where photoelectric conversion is performed and a second region where a peripheral circuit is arranged, and in which a wiring layer and a protective film covering the wiring layer are arranged, and a plurality of types of color filters arranged over the structure in the first region, wherein the structure has a concave portion of an upper surface of the protective film in the second region, in the second region, a member made of the same material as the color filter of a first type out of the plurality of types of color filters is positioned in the concave portion, and a layer made of the same material as the color filter of a second type different from the first type out of the plurality of types of color filters is positioned on the member, is provided.

According to some other embodiments, a camera comprising a solid-state image sensor and a signal processing unit, wherein a solid-state image sensor comprises a structure which includes a first region where photoelectric conversion is performed and a second region where a peripheral circuit is arranged, and in which a wiring layer and a protective film covering the wiring layer are arranged, and a plurality of types of color filters arranged over the structure in the first region, the structure has a concave portion of an upper surface of the protective film in the second region, in the second region, a member made of the same material as the color filter of a first type out of the plurality of types of color filters is positioned in the concave portion, and a layer made of the same material as the color filter of a second type different from the first type out of the plurality of types of color filters is positioned on the member, and the signal processing unit is configured to process a signal obtained by the solid-state image sensor, is provided.

Further features of the present invention will become apparent from the following description of exemplary embodiments (with reference to the attached drawings).

DESCRIPTION OF THE EMBODIMENTS

Practical embodiments of a solid-state image sensor of the present invention will be described below with reference to the accompanying drawings. Note that in a description and the drawings below, common reference numerals denote common arrangements throughout the plurality of drawings. Therefore, the common arrangements will be described with reference to the plurality of drawings mutually and descriptions of the arrangements denoted by the common reference numerals will be omitted as needed.

Figure 1A:
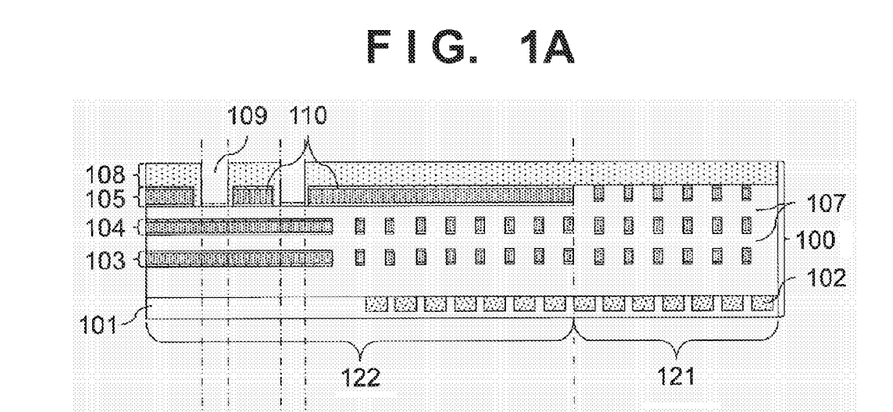
FIGS. 1A and 1B are a sectional view and a plan view showing a solid-state image sensor according to an embodiment of the present invention.
Figure 1B:
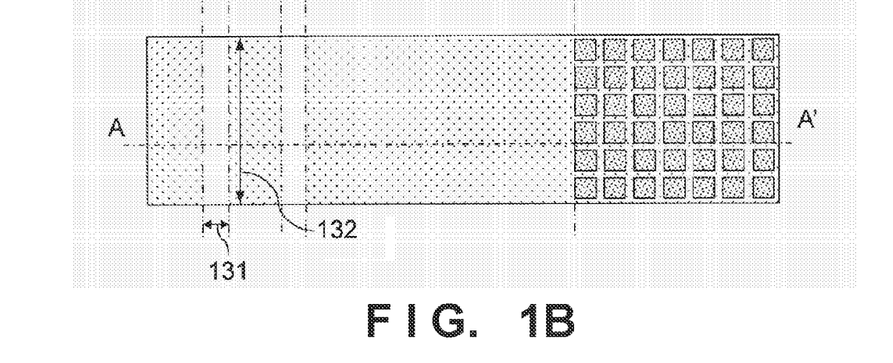

A solid-state image sensor 150 according to a first embodiment of the present invention will be described with reference to FIGS. 1A to 4. FIGS. 1A and 1B are a sectional view and a plan view showing a structure 100 used in the solid-state image sensor 150 according to the first embodiment of the present invention. The sectional view shown in FIG. 1A shows a section taken along A-A' of the plan view shown in FIG. 1B.

The structure 100 includes a substrate 101, photoelectric conversion elements 102, wiring layers 103, 104, and 105, an interlayer insulation film 107, and a passivation film 108 serving as a protective film. The plurality of photoelectric conversion elements 102 are arranged in a two-dimensional array in the substrate 101. In this embodiment, a silicon substrate as a semiconductor substrate is used for the substrate 101 and the photoelectric conversion elements 102 are formed in the silicon substrate. However, a material of the substrate 101 is not limited to this. For example, a semiconductor material other than silicon such as silicon carbide may be used as the substrate 101. Also, for example, glass, a plastic, a metal, or the like may be used for the substrate 101, the semiconductor material such as silicon may be deposited on this, and the photoelectric conversion elements may be formed. The wiring layers 103, 104, and 105 and the interlayer insulation film 107 for electrically insulating respective wiring layers are arranged above the substrate 101 where the photoelectric conversion elements 102 are arranged. The passivation film 108 which covers the respective wiring layers forms the surface of the structure 100. The structure 100 includes a light-receiving region 121 serving as the first region where received light is converted into an electrical signal by photoelectric conversion, and a peripheral region 122 serving as the second region where a peripheral circuit, a scribe line between image sensing chips, and the like are arranged and incident light is not needed. In this embodiment, each of the wiring layers 103, 104, and 105 includes a wiring line formed by an electrically conductive member such as the metal and is provided with an opening pattern for condensing light in the light-receiving region 121. The wiring layer 105 is also provided with a light-shielding pattern for shielding external light in the peripheral region 122.

In this embodiment, the wiring layer 105 has a wiring pattern 110 which supplies a power supply voltage from the peripheral region 122 to the light-receiving region 121. The upper surface of the passivation film 108 has concave portions 109 in the peripheral region 122. For example, as shown in FIG. 1A, each concave portion 109 is formed in accordance with the shape of the wiring pattern 110 arranged in the uppermost layer out of the plurality of wiring layers and may be formed along the wiring pattern 110 or may enter a gap in the wiring pattern 110. The concave portions 109 may also be formed by, for example, patterning the passivation film 108.

Three wiring layers including two layers of the wiring layers 103 and 104 in addition to the wiring layer 105 are shown in FIG. 1A. However, the number of wiring layers may be two or less, or may be four or more. Also, a function of each wiring line included in the wiring layer 105 and the other wiring layers is not limited to a function of supplying the power supply voltage. Each of these wiring lines may function as a signal wiring line or the like which transmits, for example, electrical signals from the photoelectric conversion elements 102 and signals between circuits arranged in the structure 100.

As shown in FIG. 1B, each concave portion 109 has a width 131 and a length 132 in a direction crossing the width 131. If each concave portion 109 has a rectangular shape in a planar view of the structure 100, let the width 131 be spacing between short sides and let the length 132 be spacing between long sides perpendicular to the width 131. The width of each concave portion 109 is smaller than that of the gap in the wiring pattern 110 by an amount of deposition of the passivation film 108. In this embodiment, as a structural characteristic of each concave portion 109, the aspect ratio as the ratio of the width 131 and the length 132 of the concave portion 109 is defined as (aspect ratio)= (length 132)/(width 131). In this embodiment, the planar view of the structure 100, the planar view of the passivation film 108, and the planar view of the solid-state image sensor 150 having the structure 100 are all observed in the same direction.

If a color filter material is coated by, for example, spin coating in order to form a color filter on this structure 100, striations may occur starting from the concave portions 109 each having the large aspect ratio. In this embodiment, the striations refer to striped thickness unevennesses obtained by superimposing and recognizing thickness unevennesses of respective colors if color filter layers of at least two colors are formed sequentially. According to a method of manufacturing the solid-state image sensor 150 to be described below, occurrence of such striations can be suppressed.

Figure 2A:
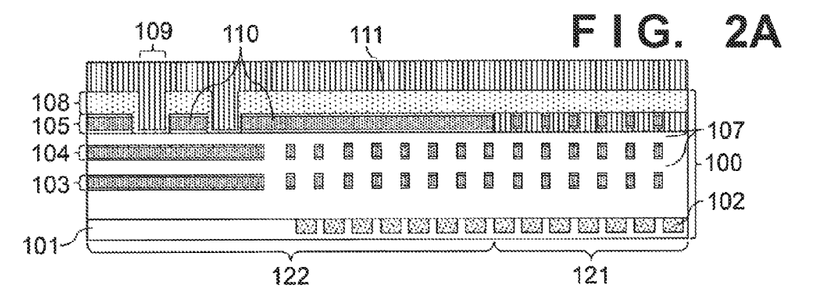
FIGS. 2A to 2D are views showing steps in a method of manufacturing the solid-state image sensor in FIGS. 1A and 1B.
Figure 2B:
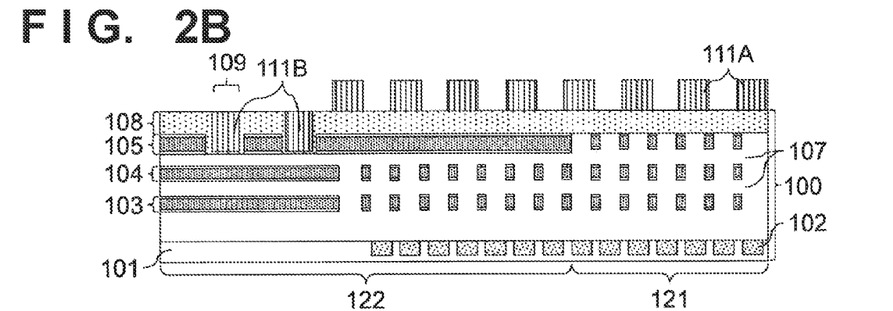

The method of manufacturing the solid-state image sensor 150 of this embodiment using the structure 100 will now be described with reference to FIGS. 2A to 2D. First, a preparing step of preparing the structure 100 shown in FIG. 1A is performed. The structure 100 can be formed by using a known semiconductor manufacturing technique. Then, a plurality of types of color filters is formed on the structure 100. First, a deposition step of depositing a first material film 111 on this structure 100 is performed by using a color filter material of the first type to be the color filter having the first color as shown in FIG. 2A. The first material film 111 is deposited by coating the color filter material of the first type by, for example, spin coating. The first material film 111 covers the upper surface of the structure 100 entirely. That is, the first material film 111 covers both the light-receiving region 121 and the peripheral region 122 of the structure 100. The first material film 111 enters the concave portions 109 of the passivation film 108. The aspect ratio of each concave portion 109 is, for example, three or more. Then, a patterning step of patterning the first material film 111 deposited in the deposition step is performed by using, for example, a photolithography method. In the patterning step, a color filter 111A of the first type positioned in the light-receiving region 121 and an embedded member 111B at least partially entering the concave portions 109 in the peripheral region 122 are formed from the first material film 111 by partially removing the first material film 111. By this patterning step, the pattern of the color filter 111A of the first type is formed in the light-receiving region 121 so as to form, for example, Bayer arrangement. Additionally, in this patterning step, the embedded member 111B obtained by entering a part of the first material film 111 into the concave portions 109 is formed in the peripheral region 122. In this embodiment, the first material film 111 is removed partially not only in the light-receiving region 121 but also in the peripheral region 122. As a result, in addition to the embedded member 111B, the pattern of the color filter 111A of the first type may be formed in the peripheral region 122. Instead of this, the first material film 111 may not be removed from the peripheral region 122. FIG. 2B shows a state in which the color filter 111A of the first type and the embedded member 111B are arranged on the structure 100.

Figure 2C:
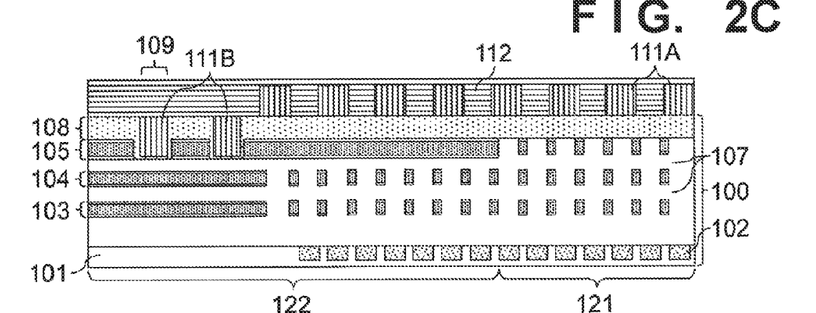

After the color filter 111A of the first type and the embedded member 111B are formed, a color filter of another type is formed subsequently. In this embodiment, a second material film 112 is deposited by using a color filter material of the second type having the second color different from the color filter 111A of the first type. The second material film 112 is deposited by coating the color filter material of the second type by, for example, spin coating. FIG. 2C shows a state at this case. Then, the pattern of a color filter 112A of the second type is formed by patterning the deposited second material film 112. Likewise, the third material film is deposited by using a color filter material of the third type having the third color, and then patterned, thereby forming a color filter 113 of the third type. As a result, a color filter layer having, for example, Bayer arrangement is formed in the light-receiving region 121. On the surface of a region other than the concave portions 109 out of the peripheral region 122, the color filters formed from the material films other than the first material film 111 contact the remaining surface. In this embodiment, a color filter layer 112B formed from the second material film 112 contacts the upper surface of the passivation film 108 in a region other than the concave portions near the concave portions 109 out of the peripheral region 122. A color filter formed from the material film different from the first material film 111 is arranged on the embedded member 111B entering the concave portions 109. In this embodiment, the color filter layer 112B formed from a part of the second material film 112 is arranged on the embedded member 111B entering the concave portions 109.

Figure 2D:
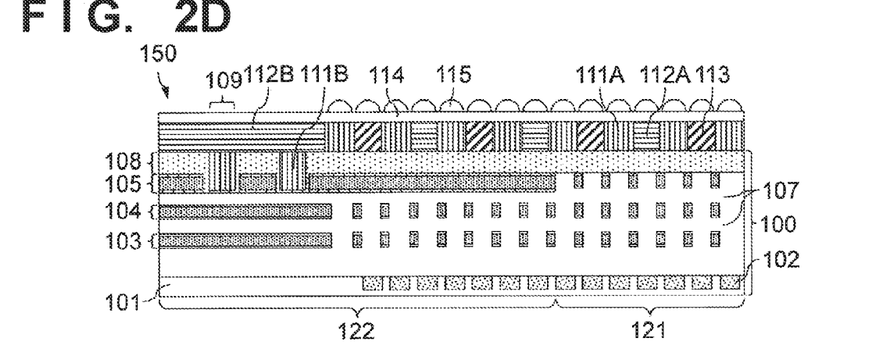

After a color filter layer including the color filters 111A, 112A, and 113 of the first, second, and third types is formed, a planarizing film 114 for reducing steps formed by the respective color filters is formed on the color filter layer. Further, microlenses 115 are arranged on the planarizing film 114. With the above-described steps, the solid-state image sensor 150 including the plurality of types of color filters is formed on the structure 100, as shown in FIG. 2D. In this embodiment, an arrangement has been described in which the planarizing film 114 and the microlenses 115 are used in order to improve light collection efficiency in the light-receiving region 121. However, this arrangement may be omitted when light collection efficiency need not be improved.

The depth of each concave portion, and the color and the thickness of each color filter layer in this embodiment will be exemplified below. However, the present invention is not limited to this. The depth of each concave portion is about 0.7 μm. The color filter 111A of the first type formed from the first material film 111 is a color filter which transmits green light and has a thickness of about 0.7 μm. The color filter 112A of the second type formed from the second material film 112 is a color filter which transmits blue light and has a thickness of about 0.75 μm. The color filter 113 of the third type formed from the third material film is a color filter which transmits red light and has a thickness of about 0.95 μm. The thickness of the planarizing film 114 is about 0.43 μm. The thickness of each microlens 115 is about 0.85 μm.

Figure 3A:
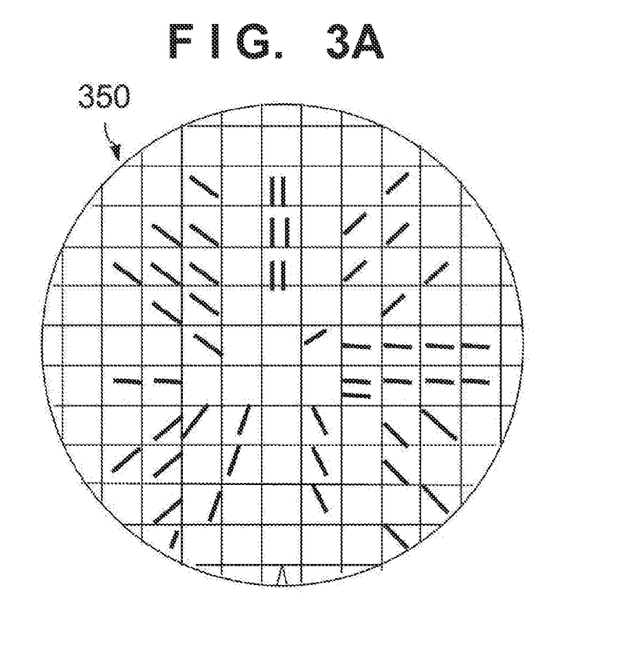
FIGS. 3A and 3B are plan views each showing striations of a structure where the solid-state image sensor is formed.
Figure 3B:
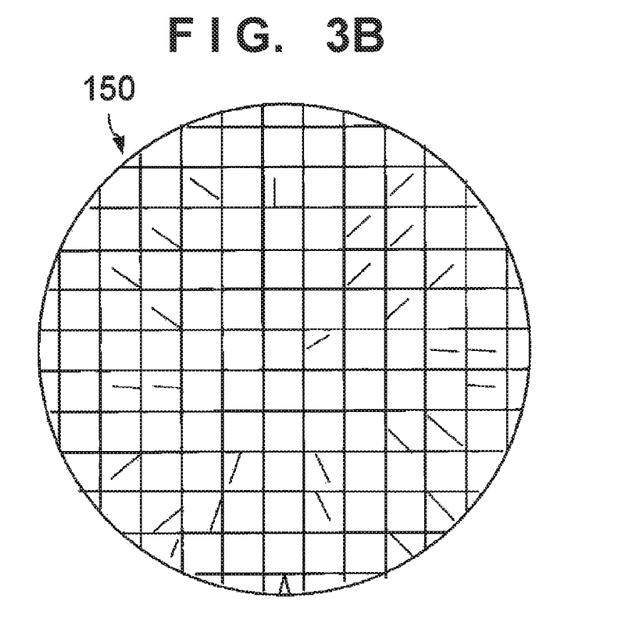

The effect of this embodiment will now be described. As a comparative example, FIG. 3A is a plan view showing a solid-state image sensor 350 in a case in which the embedded member 111B is not formed in the concave portions 109 of the peripheral region 122 when forming the color filter 111A of the first type. In this case, the striped striations running radially occur starting from the concave portions 109 on the structure, and thickness unevennesses of the color filters having the respective colors are superimposed and visually recognized, as shown in FIG. 3A. In this case, the striations are likely to occur from the concave portions 109 each having the large aspect ratio such as the aspect ratio equal to or larger than three. Meanwhile, FIG. 3B is a plan view showing the solid-state image sensor 150 of this embodiment. With the above-described manufacturing method, the concave portions 109 are embedded with the embedded member 111B, and then the color filter materials having the colors from the second color are coated by spin coating and deposited, thereby forming the color filter layer. This reduces thickness unevennesses of the color filters having the colors from the second color caused by the steps of the concave portions 109. As a result, the striations are reduced as shown in FIG. 3B.

In this embodiment, the embedded member 111B embedded in the concave portions 109 of the peripheral region 122 and the color filter 111A of the first type above the light-receiving region 121 are formed from the common first material film 111. It is therefore possible to omit a step of forming a resin layer for planarizing a structure in this embodiment, although this step is needed before forming a color filter layer in Japanese Patent Laid-Open No. 2-181967. It is therefore possible to achieve an increase in productivity and a decrease in cost.

The color filters arranged on the surface of the peripheral region 122 may not form Bayer arrangement. For example, as shown in FIG. 2D, the single-color color filter layer 112B formed from the second material film 112 may be formed in the region near the concave portions 109 out of the peripheral region 122. In this case, the color filter layer 112B formed from the second material film 112 contacts the surface of the peripheral region 122 near the concave portions 109. By arranging the color filter layer 112B as described above, the single-color color filter functions as a light-shielding layer. This makes it possible to obtain an effect of absorbing stray light.

Figure 4:
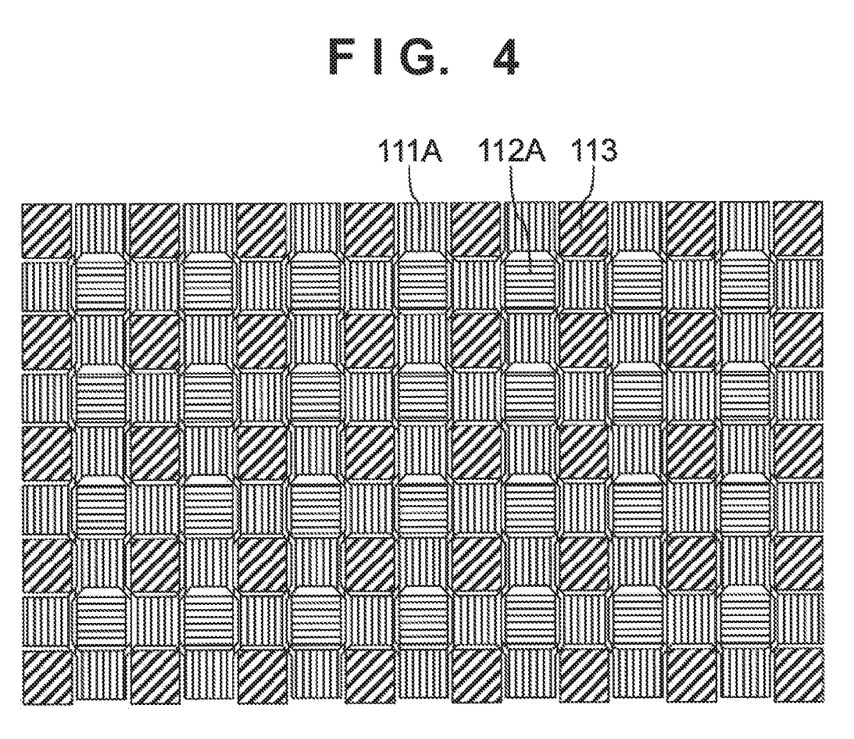
FIG. 4 is a view showing the arrangement of a color filter in a light-receiving region of the solid-state image sensor in FIGS. 1A and 1B.

In this embodiment, for example, as shown in FIG. 4, the color filter 111A of the first type may have a structural characteristic of coupling a plurality of rectangular portions to each other with their edges. Color filters having the same color may be coupled to each other with the edges of the rectangular portions. As shown in FIG. 4, all the four corners out of the edge of one rectangular portion of the color filter may be coupled to the other rectangular portions or, for example, some corners may be coupled to the other rectangular portions. Thickness unevenness may occur, under the influence of the concave portions 109, in the first material film 111 deposited by using the color filter material of the first type. Therefore, if exposure is performed by using the photolithography method in the patterning step, exposure is insufficient in a portion where a thickness is large and film peeling is more likely to occur after development. The adhesion between the color filter and the structure is improved by using the structure in which the adjacent rectangular portions of the color filter are coupled to each other. It becomes possible, by using this coupling structure, to suppress not only a reduction in the striations but also film peeling of the color filter.

Figure 7A:
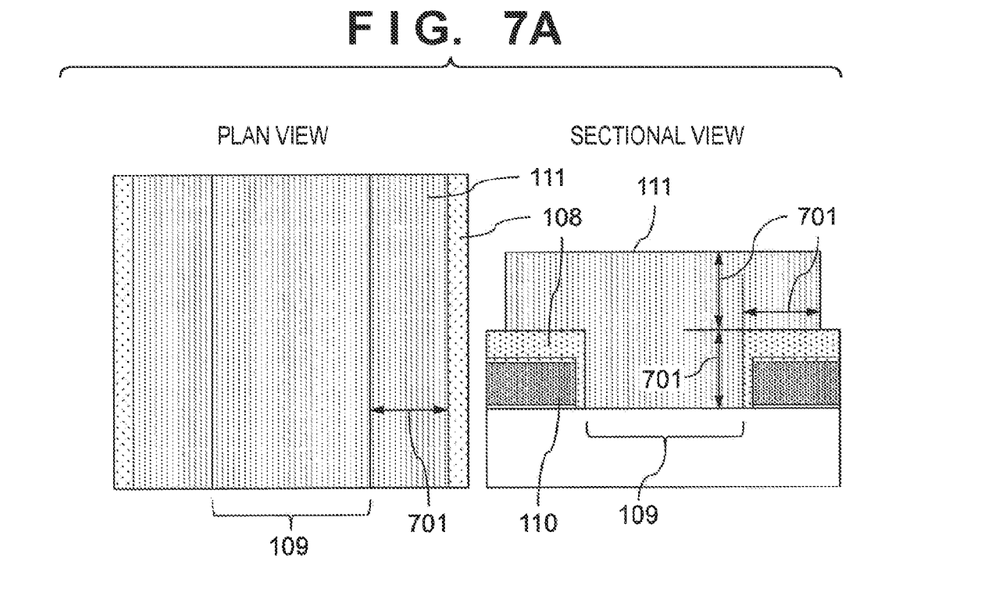
FIGS. 7A and 7B are views each showing an example of the arrangement in a concave portion 109 of a color filter of the first type.
Figure 7B:
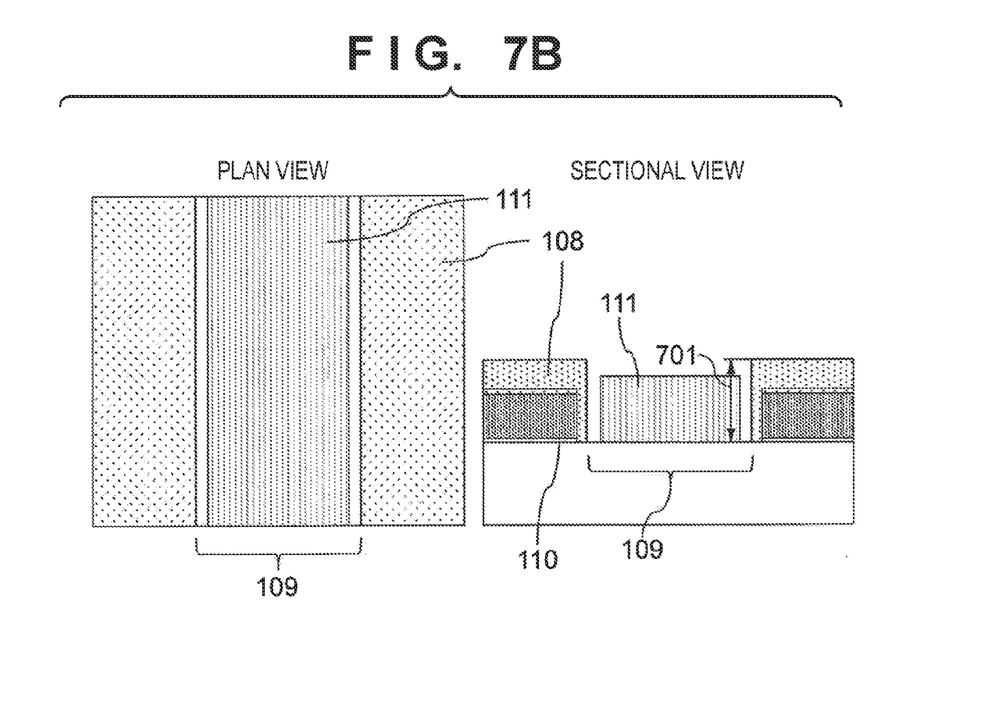

In each sectional view of FIGS. 2B to 2D, the shape of the embedded member 111B arranged in each concave portion 109 matches that of the concave portion 109. However, the shape of the embedded member 111B arranged in each concave portion 109 is not limited to this. A modification of the shape of the embedded member 111B arranged in each concave portion 109 will be described with reference to FIGS. 7A and 7B. Each of FIGS. 7A and 7B shows a plan view and a sectional view showing, by enlarging in the vicinity of one concave portion 109 out of the concave portions 109 shown in FIGS. 2B to 2D, an example of the arrangement of the embedded member 111B in the concave portion 109. For example, as shown in the plan view of FIG. 7A, the embedded member 111B may be arranged inside a range having a width equal to or smaller than a depth 701 of the concave portion 109 from the edge of the concave portion 109 to the outside of the concave portion 109 in a planar view with respect to the surface of the peripheral region 122 of the solid-state image sensor 150. Also, the embedded member 111B may have a thickness from the upper surface of the passivation film 108 as the surface of the peripheral region 122 to the upper surface of the embedded member 111B to be equal to or smaller than the depth 701 of the concave portion 109, as shown in the sectional view of FIG. 7A. In other words, the embedded member 111B may have a thickness equal to or smaller than twice the depth 701 of the concave portion 109 from the bottom of the concave portion 109. Also, for example, the embedded member 111B may not embed the concave portion 109 completely, as shown in FIG. 7B. The embedded member 111B may be arranged inside the edge of the concave portion 109 in the planar view with respect to the surface of the peripheral region 122 and also may have the thickness equal to or smaller than the depth 701 of the concave portion 109. The embedded member 111B entering and arranged in the concave portion 109 can have any size as long as an arrangement is adopted in which an influence by the step of the concave portion 109 is reduced if forming the color filters having the colors from the second color.

A solid-state image sensor 550 according to a second embodiment of the present invention will be described with reference to FIGS. 5A and 5B, and FIGS. 6A to 6C. This embodiment is different from the first embodiment in that a peripheral region 122 includes steps because of an increase in the number of wiring layers. The second embodiment may be the same as the first embodiment except for this arrangement.

Figure 5A:
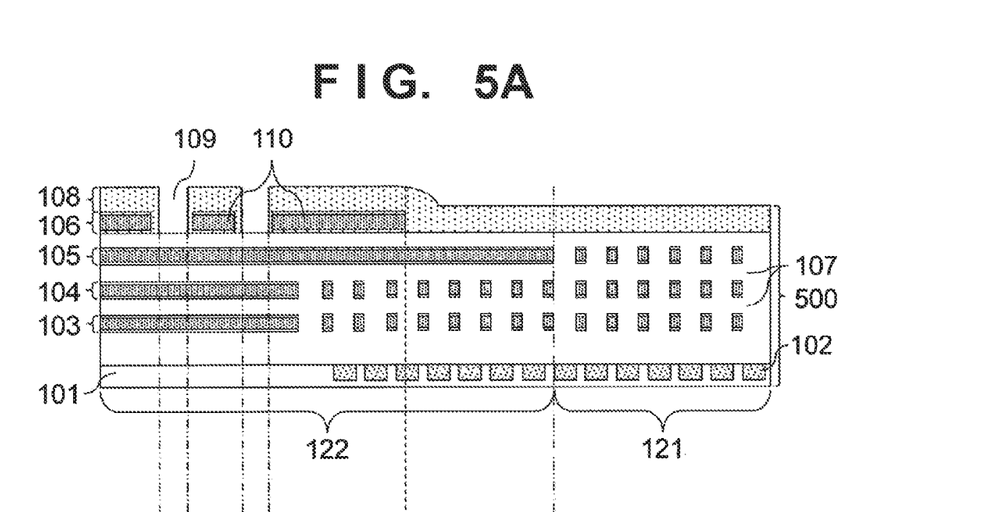
FIGS. 5A and 5B are a sectional view and a plan view showing a solid-state image sensor according to an embodiment of the present invention.
Figure 5B:
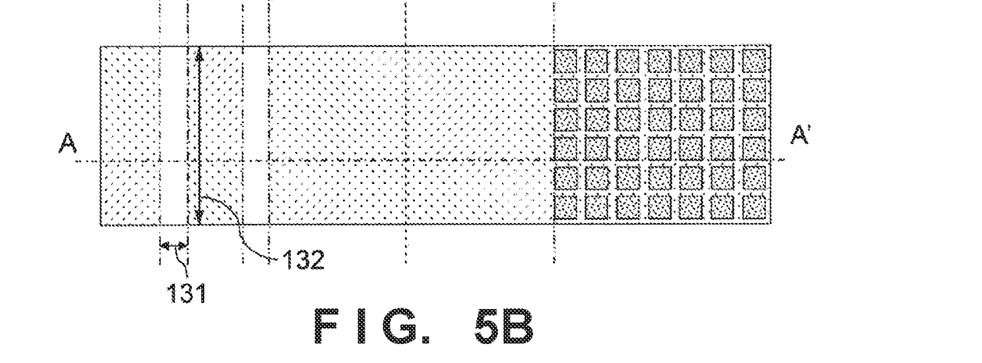

FIGS. 5A and 5B are a sectional view and a plan view showing a structure 500 used in the solid-state image sensor 550 according to the second embodiment of the present invention. The sectional view shown in FIG. 5A shows a section taken along A-A' of the plan view shown in FIG. 5B. As compared with the structure 100 shown in the first embodiment, the structure 500 includes a wiring layer 106 above the peripheral region 122, in addition to wiring layers 103, 104, and 105. Consequently, portions of the upper surface of the peripheral region 122 become higher than other portions of the upper surface of the peripheral region 122, forming steps in accordance with the thickness of the wiring layer 106 in the peripheral region 122.

In this embodiment, the wiring layer 106 has a wiring pattern 110 which supplies a power supply voltage from the peripheral region 122 to a light-receiving region 121. In accordance with the shape of the wiring pattern 110 on the uppermost layer out of a plurality of wiring layers, the surface of the peripheral region 122 has concave portions 109 on the upper surface of a passivation film 108, as in the first embodiment. FIG. 5A shows four wiring layers including three layers of the wiring layers 103, 104, and 105 in addition to the wiring layer 106. However, the number of wiring layers may be three or less, or may be five or more. Also, a function of the wiring layer 106 or the other wiring layers is not limited to a function of supplying the power supply voltage. The wiring layer 106 or the other wiring layers may function as a signal wiring line or the like which transmits, for example, electrical signals from photoelectric conversion elements 102 and signals between circuits arranged in the structure 500.

Figure 6A:
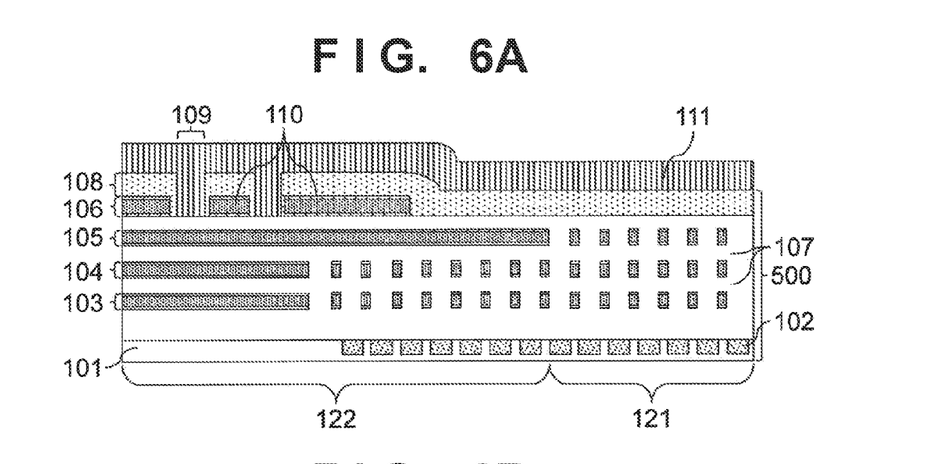
FIGS. 6A to 6C are views showing steps in a method of manufacturing the solid-state image sensor in FIGS. 5A and 5B.
Figure 6B:
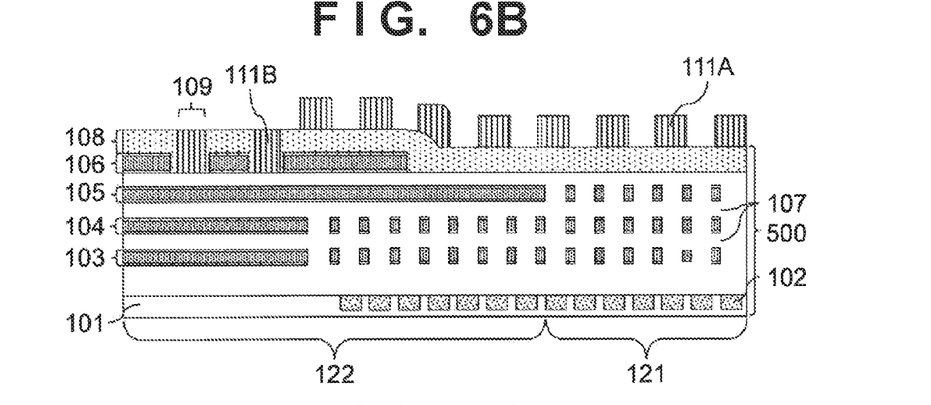
Figure 6C:
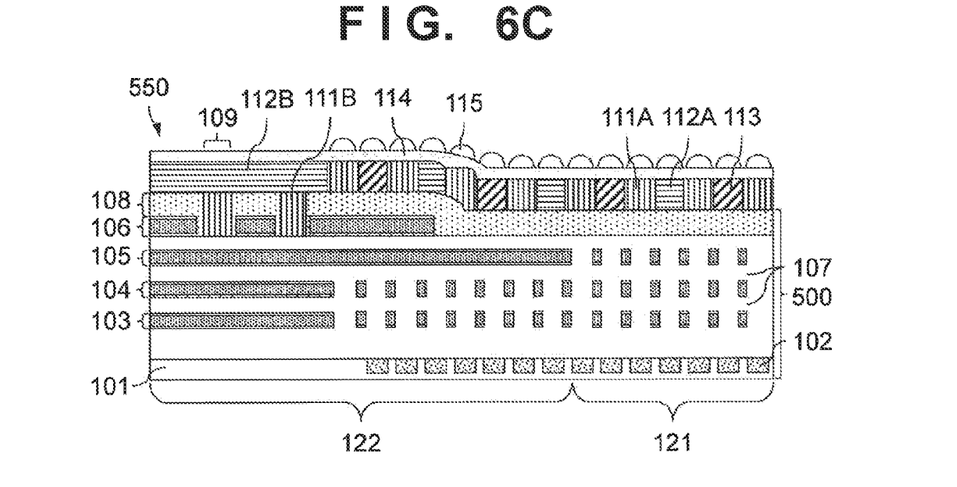

A method of manufacturing the solid-state image sensor 550 of this embodiment using the structure 500 will now be described with reference to FIGS. 6A to 6C. A formation step of forming a plurality of types of color filters on the structure 500 shown in FIG. 5A is performed. First, as shown in FIG. 6A, a deposition step of depositing a first material film 111 on this structure 500 by using a color filter material of the first type to be a color filter having the first color is performed, as in the first embodiment. The first material film is deposited by coating the color filter material of the first type by, for example, spin coating. The first material film 111 covers the upper surface of the structure 500 entirely. That is, the first material film 111 covers both the light-receiving region 121 and the peripheral region 122 of the structure 500. A part of the first material film 111 enters the concave portions 109 of the passivation film 108. The aspect ratio of each concave portion 109 is, for example, three or more. Then, a patterning step of patterning the first material film 111 deposited in the deposition step is performed by using, for example, a photolithography method. In the patterning step, a color filter 111A of the first type positioned in the light-receiving region 121 and an embedded member 111B at least partially entering the concave portions 109 in the peripheral region 122 are formed from the first material film 111 by partially removing the first material film 111. By this patterning step, the pattern of the color filter 111A of the first type is formed in the light-receiving region 121 so as to form, for example, Bayer arrangement. Additionally, in this patterning step, the embedded member 111B entering the concave portions 109 is formed in the peripheral region 122. In this embodiment, the first material film 111 is removed partially not only in the light-receiving region 121 but also in the peripheral region 122. As a result, in addition to the embedded member 111B, the pattern of the color filter 111A of the first type may be formed in the peripheral region 122. Instead of this, the first material film 111 may not be removed from the peripheral region 122. FIG. 6B shows the structure 500 where the color filter 111A of the first type and the embedded member 111B are arranged. After the color filter 111A of the first type and the embedded member 111B are formed, a color filter of another type, a planarizing film 114, and microlenses 115 are formed, as in the first embodiment. With the above-described steps, the solid-state image sensor 550 is formed on the structure 500 as shown in FIG. 6C.

In this embodiment, while the upper surface of the peripheral region 122 includes the steps, the concave portions 109 of the peripheral region 122 are embedded with the embedded member 111B. This reduces thickness unevennesses of the color filters having the colors from the second color caused by the steps of the concave portions 109. Therefore, an effect of reducing striations is also obtained in the solid-state image sensor 550 of this embodiment, as in the first embodiment.

It has been described in the first and second embodiments that the striations can be reduced by embedding the concave portions 109 of the peripheral region 122 with the first material film 111 as the color filter material of the first type having the first color and by suppressing the influence of the steps formed by the concave portions 109. Meanwhile, the color filter 111A of the first type having the first color is influenced by the concave portions 109 because the concave portions 109 exist on the upper surface of the passivation film 108 in the peripheral region 122 when depositing the first material film 111. It is therefore necessary to reduce thickness unevenness of the first material film 111 in terms of reducing the striations obtained by superimposing and recognizing thickness unevennesses of, in addition to the color filter 111A of the first type, the plurality of types of color filters having the colors from the second color.

In order to reduce thickness unevenness of a first material film 111, in this embodiment, the thickness of the first material film 111 is larger than any other thickness of a plurality of types of color filter materials other than the first material film 111 used in a solid-state image sensor. In other words, the thickness of a color filter 111A of the first type becomes larger than the thickness of any color filter other than the color filter of the first type out of the plurality of types. An arrangement other than this may be the same as in the first and second embodiments.

For example, when using a color filter configured to have the same thickness as in the first embodiment, a color filter which has the largest thickness out of the plurality of types of color filters used in the solid-state image sensor and transmits red light may be used as the color filter 111A of the first type. Since the color filter having the largest thickness is used as the color filter 111A of the first type, an influence by concave portions 109 is reduced in deposition of the first material film 111 as compared with a case in which a material film having a small thickness is used. This reduces thickness unevenness of the color filter 111A itself of the first type formed from the first material film 111. Therefore, the influence by the concave portions 109 on color filters to be formed after the color filter 111A of the first type is reduced, resulting in obtaining an effect of further reducing the striations as compared with the first and second embodiments.

In this embodiment, the color filter which transmits red light has been used as the color filter 111A of the first type formed from the first material film 111. However, the present invention is not limited to this. A decision can be made appropriately in a combination of the color filters used in the solid-state image sensor. For example, the thickness of the first material film 111 may be a thickness not exceeding twice the depth of each concave portion 109. In this case, a large convex pattern is formed in each concave portion 109 after a patterning step in which an embedded member 111B is formed. This can decrease the possibility of losing an effect of reducing the striations.

The three embodiments of the present invention have been described above. However, the present invention is not limited to these embodiments. The above-described embodiments can appropriately be modified and combined.

As an application of the solid-state image sensor according to the above-described embodiments, a camera in which the solid-state image sensor is assembled will exemplarily be described below. The concept of the camera includes not only an apparatus mainly aiming at shooting but also an apparatus (for example, a personal computer or a portable terminal) accessorily having a shooting function. The camera may be a module part such as a camera head. The camera includes the solid-state image sensor according to the present invention exemplified as the above-described embodiments, and a signal processing unit which processes a signal output from the solid-state image sensor. This signal processing unit can include, for example, a processor which processes digital data based on the signal obtained from the solid-state image sensor. An A/D converter configured to generate this digital data may be provided on a semiconductor substrate of the solid-state image sensor or on another semiconductor substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-077949, filed Apr. 6, 2015 which is hereby incorporated by reference wherein in its entirety.

What is claimed is:

1. A method of manufacturing a solid-state image sensor, the method comprising:
    preparing a structure which includes a first region where photoelectric conversion is performed and a second region where a peripheral circuit is arranged, and in which a wiring layer and a protective film covering the wiring layer are arranged;
    depositing, over the structure, a first material film by using a color filter material of a first type;
    forming a color filter of the first type positioned in the first region from the first material film by patterning the first material film;
    depositing, over the structure, a second material film by using a color filter material of a second type different from the color filter material of the first type after the forming the color filter of the first type; and
    forming a color filter of the second type positioned in the first region from the second material film by patterning the second material film,
    wherein the structure has a concave portion of an upper surface of the protective film in the second region, a ratio of a width and a length of the concave portion being not less than three in a planar view with respect to the upper surface of the protective film,
    a part of the first material film enters the concave portion in the depositing the first material film,
    the first material film is patterned so as to form a member including the part of the first material film from the first material film in the forming the color filter of the first type, and
    the second material film covers the member in the depositing the second material film.

2. The method according to claim 1, wherein the second material film is patterned such that a part of the second material film remains on the member in the forming the color filter of the second type.

3. The method according to claim 1, further comprising depositing, over the structure, a third material film by using a color filter material of a third type different from the color filter material of the second type after the forming the color filter of the second type, and
    forming a color filter of the third type positioned in the first region from the third material film by patterning the third material film.

4. The method according to claim 1, wherein the member is arranged inside a range having a width not more than a depth of the concave portion from an edge of the concave portion to an outside of the concave portion in a planar view with respect to an upper surface of the protective film in the forming the color filter of the first type, and
    a thickness from the upper surface of the protective film to an upper surface of the member is not more than the depth.

5. The method according to claim 1, wherein the member is arranged inside an edge of the concave portion in a planar view with respect to an upper surface of the protective film, and
    the member has a thickness not more than a depth of the concave portion.

6. The method according to claim 1, wherein an upper surface of the protective film in the second region has a portion higher than an upper surface of the protective film in the first region.

7. The method according to claim 1, wherein a thickness of the color filter of the first type is larger than a thickness of any color filter other than the color filter of the first type.

8. The method according to claim 1, wherein the color filter of the first type is coupled in the first region.

9. The method according to claim 1, wherein the color filter of the first type is a color filter which transmits green light.

10. The method according to claim 1, wherein the color filter of the second type is a color filter which transmits blue light.

11. The method according to claim 1, wherein the concave portion is formed along a wiring pattern of the wiring layer.

* * * * *